(12) United States Patent
Ma et al.

(10) Patent No.: US 7,329,861 B2
(45) Date of Patent: Feb. 12, 2008

(54) INTEGRALLY PACKAGED IMAGING MODULE

(75) Inventors: Guolin Ma, Milpitas, CA (US);
Bahram Afshari, Los Altos, CA (US)

(73) Assignee: Micron Technology, Inc., Boise, ID (US)

( * ) Notice: Subject to any disclaimer, the term of this patent is extended or adjusted under 35 U.S.C. 154(b) by 320 days.

(21) Appl. No.: 10/684,619

(22) Filed: Oct. 14, 2003

(65) Prior Publication Data
US 2005/0077458 A1 Apr. 14, 2005

(51) Int. Cl.
*H04N 5/225* (2006.01)

(52) U.S. Cl. ............... 250/239; 257/729; 257/730; 257/433

(58) Field of Classification Search ......... 250/239; 257/433–440, 59, 678–680, 666, 676, 686, 257/777; 438/106–110, 64–70
See application file for complete search history.

(56) References Cited

U.S. PATENT DOCUMENTS

| | | | |
|---|---|---|---|
| 6,130,448 A | 10/2000 | Bauer et al. | |
| 6,483,101 B1 * | 11/2002 | Webster | 250/239 |
| 6,571,466 B1 | 6/2003 | Glenn et al. | |
| 6,596,560 B1 | 7/2003 | Hsu | |
| 6,734,419 B1 * | 5/2004 | Glenn et al. | 250/239 |
| 6,759,642 B2 * | 7/2004 | Hoshino | 250/208.1 |
| 6,822,326 B2 * | 11/2004 | Enquist | 257/729 |
| 6,930,327 B2 * | 8/2005 | Maeda | 257/59 |
| 2006/0044450 A1 * | 3/2006 | Wolterink et al. | 348/340 |

FOREIGN PATENT DOCUMENTS

| | | |
|---|---|---|
| WO | WO99/40624 | 8/1999 |
| WO | WO01/15237 | 3/2001 |

OTHER PUBLICATIONS

Ted Tessier, VP., Adv. Applications Development; Amkor Technology, Inc. product brochure entitled "Recent Developments in Wafer Level Packaging"; 13 pgs.
Shellcase products webpage entitled "ShellOP"; 3 pgs. (w w w.shellcase.com/pages/products/asp).

* cited by examiner

*Primary Examiner*—Georgia Epps
*Assistant Examiner*—Tony Ko
(74) *Attorney, Agent, or Firm*—RatnerPrestia

(57) ABSTRACT

An integrally packaged imaging module includes an integrated circuit (IC), including an image sensing device formed on a semiconductor substrate, and wafer level packaging enclosing the IC. The wafer level packaging includes a transparent enclosure portion adapted to permit image acquisition of an image by the image sensing device over a desired range of wavelengths, and a first spacing structure providing a cavity between an inner surface of the transparent enclosure portion and the image sensing device. A depth of the cavity is configurable along an axis perpendicular to the semiconductor substrate to control a distance between an outer surface of the transparent enclosure portion and the image sensing device.

13 Claims, 17 Drawing Sheets

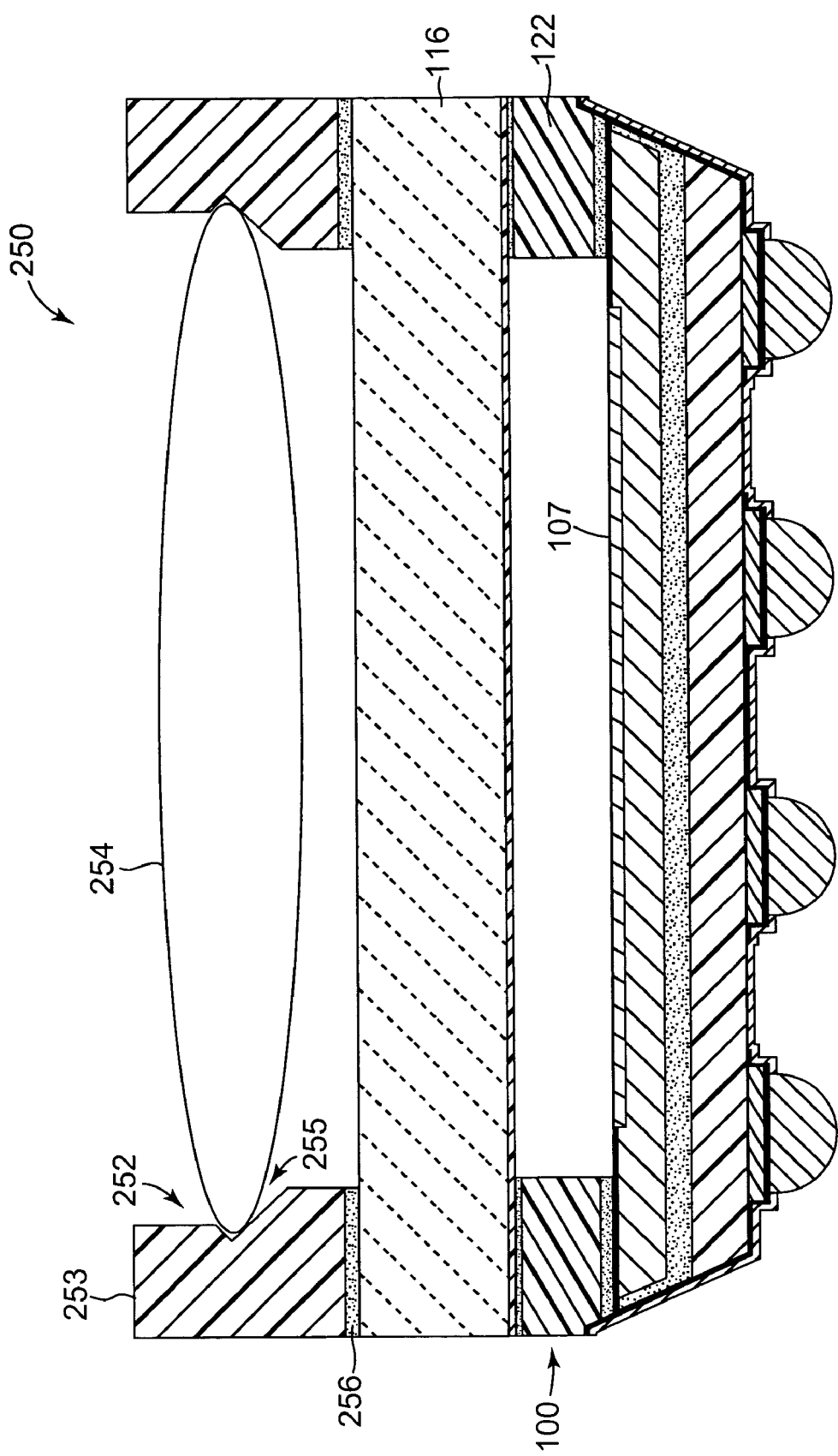

INTEGRALLY PACKAGED IMAGING MODULE

THE FIELD OF THE INVENTION

The present invention relates generally to imaging modules, and more particularly to an integrally-packaged imaging module.

BACKGROUND OF THE INVENTION

Digital imaging technology is being used in an increasing variety of mass-produced applications and in increasing production volumes. For example, miniature fixed-focus digital camera modules are being incorporated into end products such as portable telephones and personal digital assistants (PDA's). Given the new high volume applications for imaging modules, it is a continuing objective for imaging module fabricators to reduce their size and cost, and to provide imaging module designs that simplify incorporating the imaging modules into end products made by original equipment manufacturers (OEMs).

Imaging modules generally include an image sensor that detects an image and converts it into an electrical signal representation. An image processor is employed to further manipulate the image signal into an image of a suitable quality for output. Electrical contacts provide connectivity between the imaging modules and the end products incorporating the imaging modules.

One type of imaging module is commonly referred to as a camera module. Camera modules are known in the art as miniature complete camera assemblies for incorporation into end products. A camera module generally includes an image sensor, an image processor, interface circuitry and hardware, and a lens for focusing incoming light onto the image sensor. A conventional camera module also typically includes a chassis and/or enclosure for mounting the various electronic and optical components and for protecting the components from particulate and spurious light contamination. A typical chassis/enclosure includes focusing features for aligning the lens and image sensor during fabrication. The focusing features are commonly in the form of mating pieces as part of the main chassis/enclosure, and lens assembly piece. During fabrication, the mating pieces are specially aligned so that the lens directs an image onto the image sensor. This assembly step is typically performed on each individual camera module fabricated. Therefore, the assembly step is time consuming and labor-intensive, and therefore costly.

End products that incorporate imaging modules include a mechanism for mechanically and electrically attaching the imaging modules to the host devices. Conventional mechanisms for attaching the imaging modules to the host devices tend to be costly when compared to the costs of attaching other types of electronic/electrical hardware, such as integrated circuits (IC's). Conventional imaging modules are not suitable for automatic assembly. A conventional imaging module is typically located on a circuit board that is enclosed by the host device's housing. The imaging module is secured to the circuit board with adhesive, mounting hardware, or structural features. In other types of conventional designs, the imaging module attaches mechanically to the housing of the host device. In these examples, an electrical connection between the imaging module and the host device is typically accomplished with a multi-conductor cable and mating electrical connectors on the circuit board. Such features are expensive, not well suited for automatic assembly, bulky, and less reliable than soldered connections.

Standard automatic electronic assembly processes are not readily adaptable to support automatic mounting and connecting of conventional imaging modules. Thus, assembly of host devices involves manual operations to mount and electrically connect the imaging modules. For example, conventional digital camera modules are mounted to the host device by hand, and the connector is inserted by hand. By nature, manual operations are slow, labor-intensive, and prone to error; therefore, manual assembly steps are expensive. Furthermore, the material costs of conventional imaging modules include the costs of the mounting and connecting hardware. Moreover, the space within the host device needed to accommodate conventional imaging modules includes space for the mounting and connecting mechanism. Additional space requirements inhibit host device miniaturization, cost reduction, and marketability.

By contrast, electrical/electronic hardware such as integrate circuits is typically assembled onto a host device's circuit board automatically. Most commonly, surface-mount technology (SMT) is employed, where each component is robotically placed and automatically soldered onto the circuit board using solder wave or re-flow processing. The soldered joints accomplish a mechanical and electrical attachment.

In a typical SMT process, a circuit board is first prepared to accept solderable components. Most commonly, solder paste is applied selectively to electrical pads that accept contacts of the electrical components to be mounted thereupon. Next, the electrical components are automatically placed into their appropriate positions on the circuit boards using robotics. This process is referred to as pick-and-place, or onsertion. The electrical components are temporarily held in place on the circuit board pads by the solder paste's adhesive properties. Next, the circuit board with components positioned thereupon is subjected to a solder re-flow process in order to create permanent solder joints at all electrical contact/pad interfaces.

A solder re-flow process involves heating the solder paste to a temperature where the solder melts and flows thoroughly onto both the mounting pads and electrical component contacts. The temperature of the solder is then allowed to drop, causing the solder to solidify into solder joints that mechanically and electrically bond the components to the circuit board. The temperature at the molten solder joints during the re-flow process is on the order of 250° C. Such temperatures can be reached by a variety of means, including conductive, convective, or radiant heating of the solder joint sites.

Components for use on circuit boards assembled using a re-flow process must be able to withstand the process temperatures. However, as with any manufactured product in mass production, conventional digital camera modules are constructed from low-cost materials whenever possible. Enclosure materials and lens materials are often made from various plastics. Although certain plastic materials can withstand re-flow temperatures for short periods of time, presently available materials are not suitable as lens material, which must have particular optical characteristics.

Recent advances in the art have achieved fully integrated imaging modules. These modules are essentially fully packaged integrated circuits having an optically transparent window that allows the image sensor IC to capture an image. In camera module applications, such imaging modules reduce cost, parts count and camera module assembly costs with their smaller size and increased level of integration.

Still, camera modules incorporating these imaging modules use separate housings and lens assemblies, and lens alignment procedures as part of their manufacture. To date, no practical solution has been proposed for a fully integrated camera module, or a low-cost imaging module that can easily be assembled into a camera module.

SUMMARY OF THE INVENTION

Embodiments of the present invention provide an improved integrally packaged imaging module, which includes an integrated circuit (IC), including an image sensing device formed on a semiconductor substrate, and wafer level packaging enclosing the IC. The wafer level packaging includes a transparent enclosure portion adapted to permit image acquisition of an image by the image sensing device over a desired range of wavelengths, and a first spacing structure providing a cavity between an inner surface of the transparent enclosure portion and the image sensing device. A depth of the cavity is configurable along an axis perpendicular to the semiconductor substrate to control a distance between an outer surface of the transparent enclosure portion and the image sensing device.

BRIEF DESCRIPTION OF THE DRAWINGS

FIG. 4 illustrates an embodiment of an imaging module that includes a lens support.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
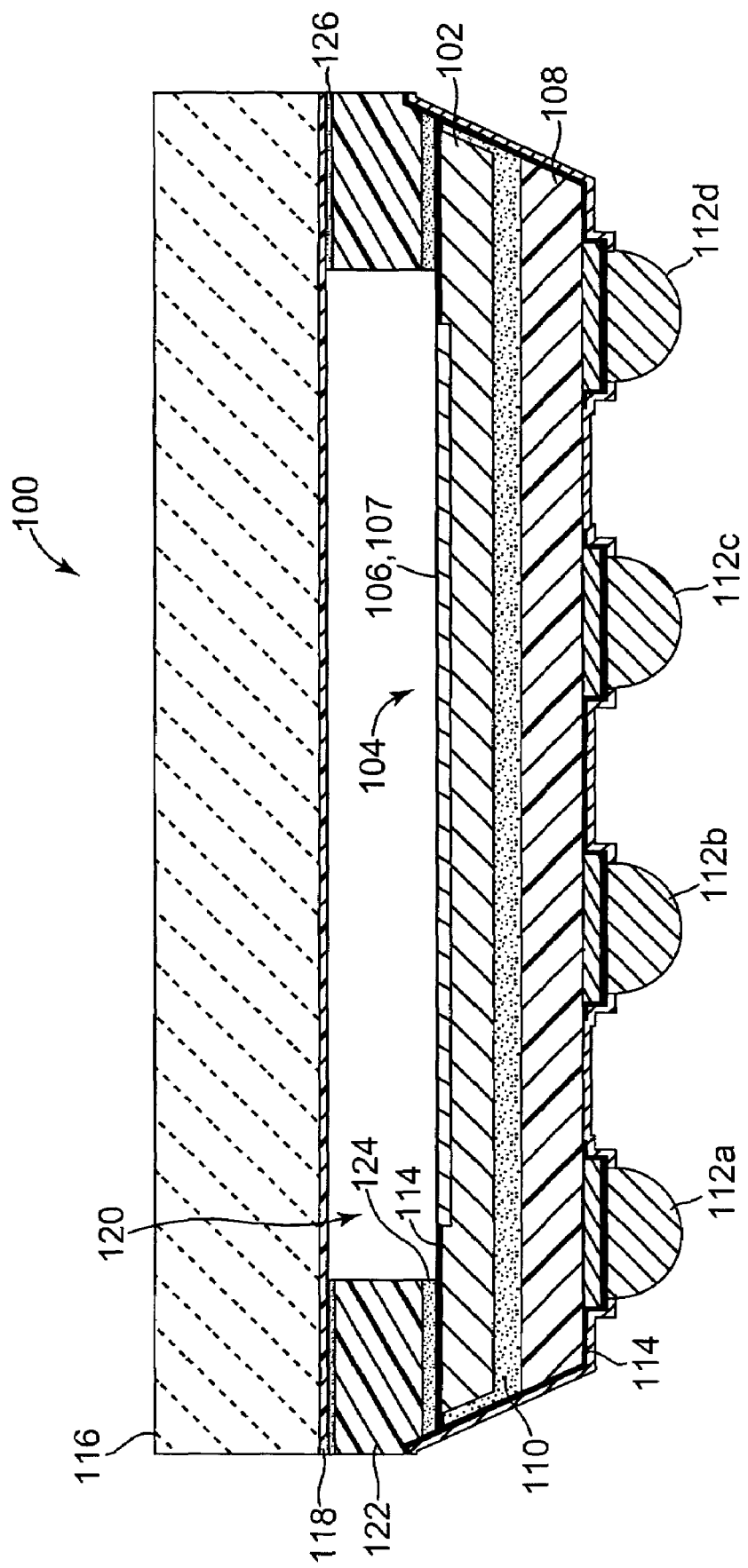
FIG. 1A illustrates an integrally-packaged imaging module according to one aspect of the present invention.

FIG. 1A illustrates an integrally-packaged imaging module 100 according to one aspect of the present invention. Imaging module 100 includes semiconductor substrate 102. In one embodiment, the surface of semiconductor substrate 102 includes an active area 104 containing integrated circuitry 106, which includes an image sensing device 107, an image processor, interface logic, and power conditioning circuitry. In one embodiment, image sensing device 107 includes an array of charge-coupled devices (CCDs). In another embodiment, image sensing device 107 is a CMOS technology image sensor. In one embodiment, image sensing device 107 includes microlenses, with each microlens situated over a corresponding pixel of the image sensing device 107 for focusing incoming light onto the corresponding pixel.

Imaging module 100 includes wafer-level packaging enclosing the semiconductor substrate 102. Wafer-level packaging technology is generally known in the art, and is sometimes referred to as chip-scale packaging (CSP). Wafer-level packaging technology permits integrated circuits formed on a wafer to be packaged for end-product use before being individually separated from the wafer by a dicing process. Thus, an entire wafer containing hundreds or thousands of integrated circuit die is processed in a single wafer-level packaging process to simultaneously package every integrated circuit on the wafer.

The wafer-level packaging of the imaging module 100 includes packaging substrate 108 attached to semiconductor substrate 102 with an adhesive layer 110. In one embodiment, packaging substrate 108 is formed from glass. In another embodiment, packaging substrate 108 is formed from silicon. In one embodiment, adhesive layer 110 includes an epoxy compound situated between the interfacing surfaces of semiconductor substrate 102 and packaging substrate 108.

The wafer-level packaging of the imaging module 100 further includes electrical contacts 112a, 112b, 112c, and 112d, collectively referred to as electrical contacts 112. In one embodiment, electrical contacts 112 are adapted for mounting imaging module 100 onto a printed circuit board (PCB) of an end product. In one embodiment, electrical contacts 112 are solder bumps situated in a standard ball grid array (BGA) configuration. In another embodiment, electrical contacts 112 are in the form of pins for through-hole insertion. It will be recognized by one skilled in the art that electrical contacts 112 can have numerous other forms. For connecting electrical contacts 112 to integrated circuitry 106, imaging module 100 employs redistribution structures 114. In one embodiment, redistribution structures 114 are formed from deposited metallic material along the surfaces of semiconductor substrate 102, packaging substrate 108, and adhesive layer 110. In another embodiment, the redistribution structures 114 are formed using thin film fabrication technology that is known in the art. In yet another embodiment, redistribution structures 114 include wire bonds. It will be recognized by one skilled in the art that a variety of wafer level/CSP technologies can be used for creating redistribution structures 114 that connect input/output nodes of the integrated circuitry 106 to the electrical contacts 112 within the wafer-level packaging.

The wafer-level packaging of imaging module 100 facilitates image acquisition by the image sensing device 107 while providing an enclosure protecting the integrated circuitry 106 from contamination. Imaging module 100 includes a transparent enclosure portion 116 situated to permit light to enter the packaging of imaging module 100 and reach the image sensing device 107 of integrated circuitry 106. In one embodiment, the transparent enclosure portion 116 is formed from glass. In another embodiment, transparent enclosure portion 116 is formed from plastic having sufficient optical properties to permit image acquisition of a desired image quality. It will be recognized by one skilled in the art that a variety of known moldable and/or machinable materials can be used to form transparent enclosure portion 116. In one embodiment, the transparent enclosure portion is capable of temporarily withstanding temperatures on the order of 250° C., to which electronic components are commonly exposed during solder re-flow processing in circuit card assembly processes.

In one embodiment, transparent enclosure portion 116 includes an optical filter to permit only a certain range of desired frequencies to pass through it. In one form of this embodiment, an optical filtering film 118 is applied to a surface of transparent enclosure portion 116. In one embodiment, optical filtering film 118 is a reflective infrared (IR) filter deposited on a surface of transparent enclosure portion 116. In another embodiment, the material from which transparent enclosure portion 116 is formed has filtering properties with respect to undesired wavelengths.

In one embodiment, imaging module 100 includes a cavity 120 within its package. Cavity 120 is a space between the image sensing device 107 and the innermost surface of transparent enclosure portion 116. In one embodiment, cavity 120 is void of any solid or liquid material. In one embodiment, cavity 120 has an index of refraction that is different from that of the transparent enclosure portion 116. In one embodiment, cavity 120 has an index of refraction of approximately 1.0. In one embodiment, cavity 120 contains atmospheric gasses. In another embodiment, cavity 120 is a vacuum.

One advantage provided by cavity 120 is to permit the image sensing device 107 to function optimally. For example, where image sensing device 107 includes microlenses and is designed to operate in a medium having an index of refraction of 1, cavity 120, in one embodiment, provides a space adjacent to the microlenses that has an index refraction of about 1.

Another advantage provided by cavity 120 is realized in one embodiment where cavity 120 provides a spacing between the outer surface of transparent enclosure portion 116 and the image sensing device 107 that has a distance greater than the thickness of transparent enclosure portion 116. A spacing between the outer surface of transparent enclosure portion 116 and the image sensing device 107 is desirable because it reduces the effects of particulate contamination on the surface of the transparent enclosure portion 116. For example, consider a dust particle on the transparent enclosure portion 116 between the image sensing device 107 and a light source. When the dust particle is closer to the image sensing device 107, less light is unable to pass around the particle to illuminate the blocked pixels, resulting in a darker shadow over the pixels. By contrast, when the dust particle is farther from the image sensing device 107, more light is able to pass around the dust particle to illuminate the blocked pixels. Therefore, cavity 120 permits imaging module 100 to have a greater spacing distance between the outer surface of transparent enclosure portion 116 and image sensing device 107 while keeping fixed the thickness of transparent enclosure portion 116. Benefits of improved immunity to particulate contamination provided by cavity 120 include an ability to perform further fabrication processes on imaging module 100 in a less stringent cleanroom environment.

Cavity 120 provides a further advantage by facilitating an ability to easily control the distance between the outer surface of transparent enclosure portion 116 and the image sensing device 107. One example of a situation where controlling this distance is desirable is in the fabrication of a camera module according to one aspect of the present invention that is described below. One embodiment of such a camera module includes an integrally packaged lens aligned to focus an image onto the image sensing device 107, wherein the focusing is achieved through the controlled cavity height controlled to within +/-10 microns.

Figure 1B:
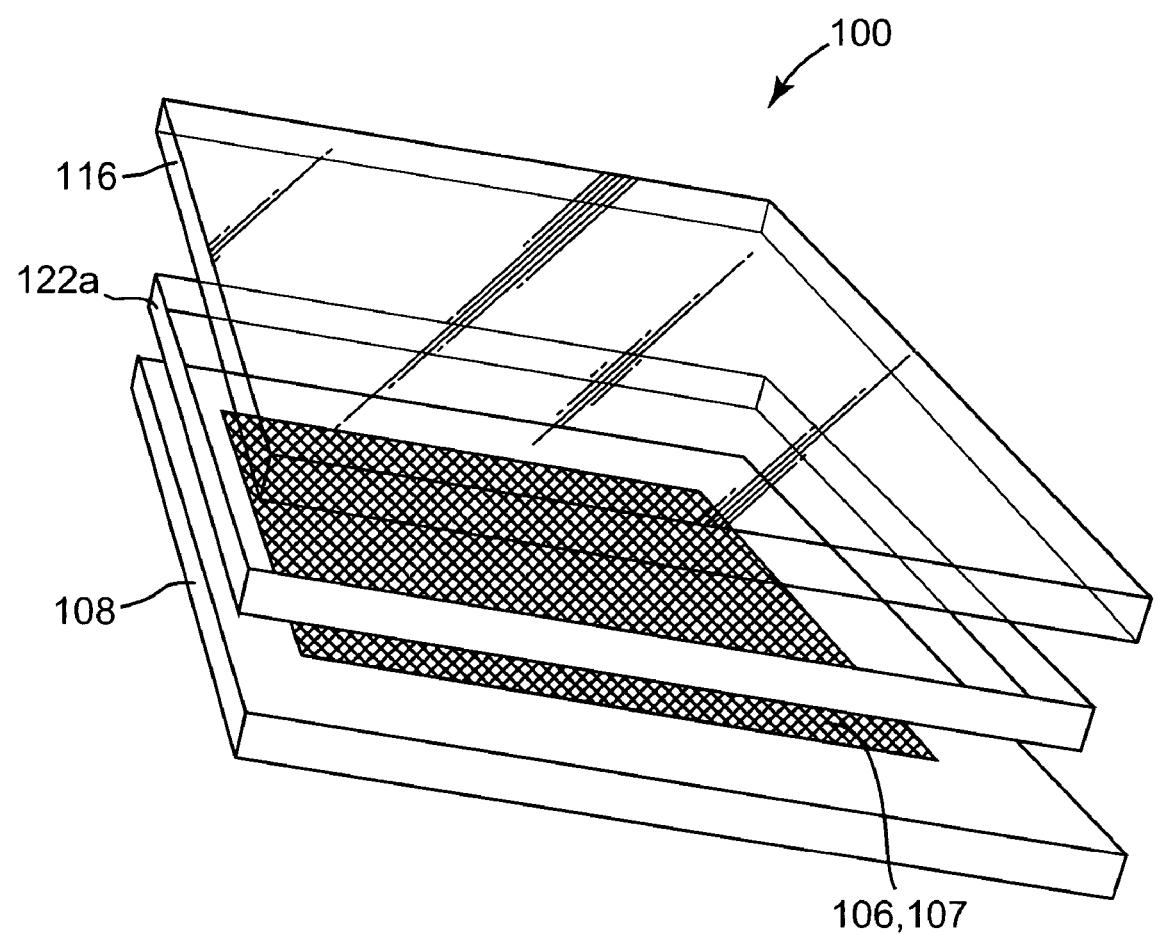
FIG. 1B is an exploded-view diagram illustrating one embodiment of the imaging module of FIG. 1A.

In one embodiment, cavity 120 is formed by a spacing structure indicated at 122. In one embodiment, spacing structure 122 is situated between semiconductor substrate 102 and transparent enclosure portion 116, and forms a wall enclosing the image sensing device 107. FIG. 1B is an exploded-view diagram illustrating one embodiment of imaging module 100. In the embodiment of FIG. 1B, spacing structure 122a is one embodiment of spacing structure 122 (FIG. 1A). Spacing structure 122a is a four-walled spacer rim surrounding the perimeter of integrated circuitry 106 and image sensing device 107.

Figure 1C:
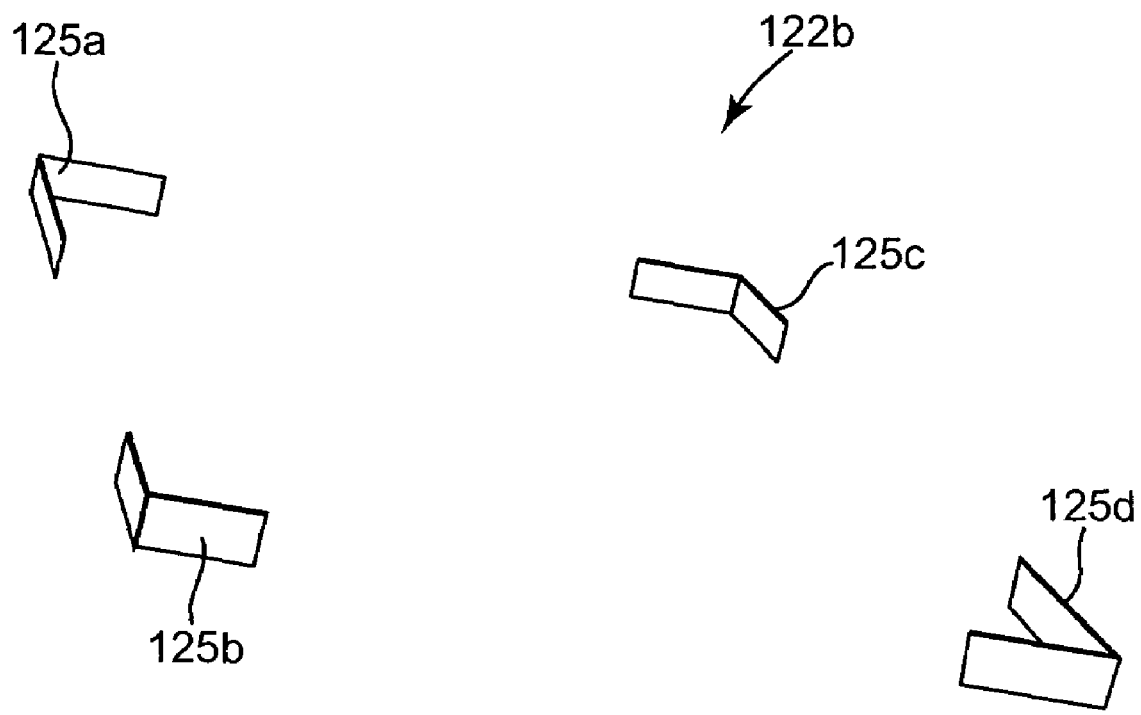
FIG. 1C is a diagram illustrating one embodiment of a spacing structure that is a part of one embodiment of the imaging module of FIG. 1A.

FIG. 1C illustrates a spacing structure set 122b, which is another embodiment of spacing structure 122. Spacing structure set 122b is comprised of four non-contiguous pieces 125a-125d. In one embodiment of the imaging module 100, spacing structure set 122b is employed.

Referring back to FIG. 1A, spacing structure 122 is sandwiched between semiconductor substrate 102 and transparent enclosure portion 116. In one embodiment, spacing structure 122 is formed from plastic. In another embodiment, spacing structure 122 is formed from glass. In yet another embodiment, spacing structure 122 is formed from silicon. It will be understood by one skilled in the art that spacing structure 122 can be formed from a variety of moldable and/or machinable materials suitable for wafer-level packaging.

In one embodiment, spacing structure 122 is attached to semiconductor substrate 102 with an adhesive layer 124, and to transparent enclosure portion 116 with an adhesive layer 126. In one embodiment, adhesive layers 124 and 126 are both layers of a selectively-applied epoxy compound. In another embodiment, spacing structure 122 is fastened to semiconductor substrate 102 with a hot press process, and a separate adhesive layer is not used. In one embodiment, spacing structure 122 is welded to transparent enclosure portion 116 via one or more welded joints.

In one embodiment, the height of spacing structure 122 is adjusted during the assembly of the imaging module 100 as part of controlling the spacing between the outer surface of transparent enclosure portion 116 and image sensing device 107. In one embodiment, the height of spacing structure 122 is reduced based on a measured thickness of transparent enclosure portion 116, thereby correcting for any variance in the thickness of the transparent enclosure portion that exceeds a required tolerance. In one embodiment, the height of the spacing structure 122 defining cavity 120 along an axis perpendicular to the image sensing device 107 is controllable to within +/−50 microns.

The controlling of the height of spacing structure 122 can be accomplished in a variety of ways, as understood by one skilled in the art. For example, in one embodiment, spacing structure 122 is deformed in a controlled manner during a hot press process of adhering spacing structure 122 to semiconductor substrate 102. In another embodiment, spacing structure 122 is machined to a desired height.

In another embodiment, the controlling of the height of cavity 120 includes dynamically adjusting the thickness of adhesive layers 124 and/or 126 during the attachment of the spacing structure 122 to the semiconductor substrate 102. In one such embodiment, adhesive layer 124 is a curable adhesive compound applied to the upper surface of semiconductor substrate 102. The adhesive compound is applied such that it has an initial thickness greater than the desired spacing between the upper surface of semiconductor substrate 102 and the spacing structure 122. Next, while the adhesive compound is uncured and in a liquid state, the spacing structure is controllably positioned into the volume of the initial adhesive compound application according to specified tolerances, thereby displacing some of the adhesive compound, and held in place. Finally, the adhesive compound cures, and permanently holds the spacing structure substantially in the controllably positioned location.

Figure 2A:
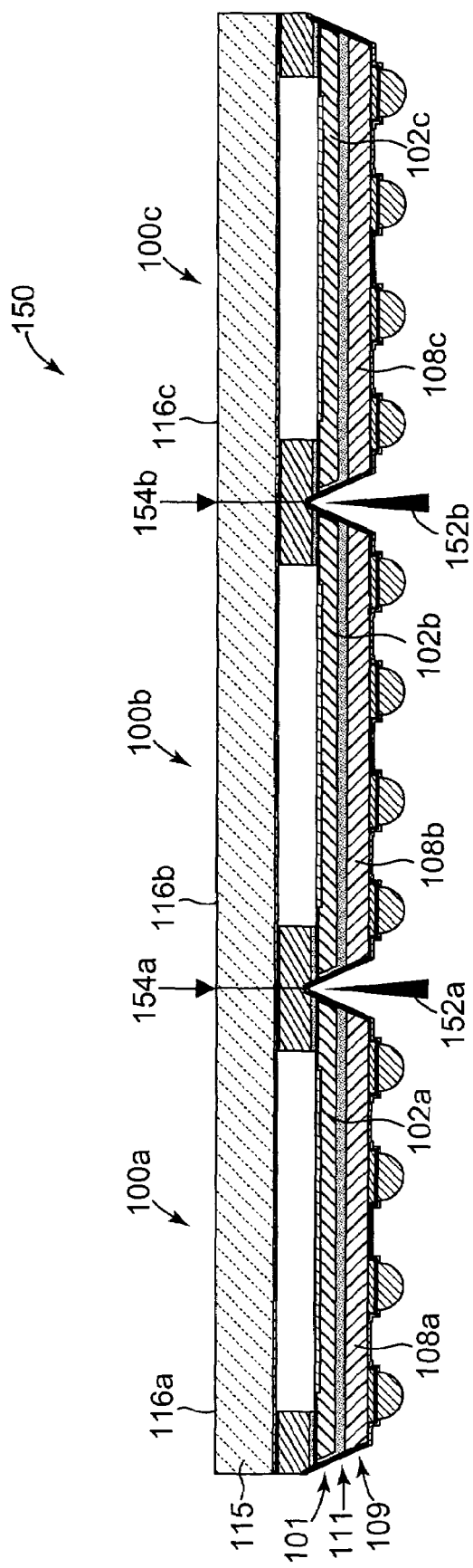
FIG. 2A illustrates a cross-section of an array of partially assembled imaging modules just prior to singulation according to one embodiment of the present invention.

FIG. 2A illustrates a cross-section of an array 150 of partially assembled imaging modules 100a, 100b, and 100c (collectively referred to as imaging modules 100) just prior to singulation. Array 150 is assembled from a single semiconductor wafer 101 that has been separated into individual semiconductor substrates 102a, 102b, and 102c. Likewise, packaging substrates 108a, 108b, and 108c are each separated out from a single packaging substrate layer 109 attached to the semiconductor wafer 101 at adhesive layer 111. Transparent enclosure portions 116a, 116b, and 116c of imaging modules 100a, 100b, and 100c, respectively, have not yet been separated from one another and are thus shown as a single transparent enclosure layer 115. In one embodiment, final singulation is accomplished with dicing blades 152a and 152b along dicing planes indicated at 154a and 154b.

Figure 2B:
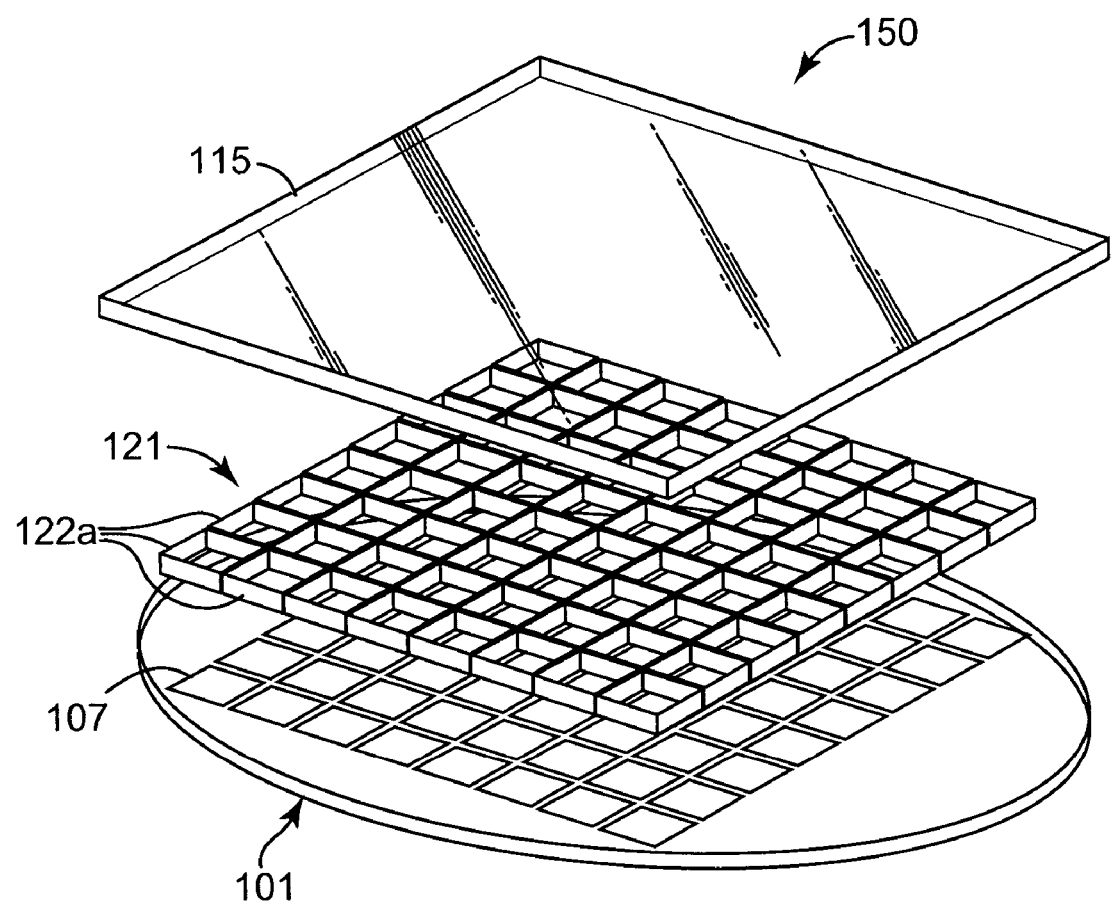
FIG. 2B illustrates one embodiment of a wafer-level packaging process for the imaging module of FIG. 1A.

FIG. 2B illustrates a wafer-level packaging process for imaging modules 100. An exploded-view diagram of a partially-assembled array 150 of imaging modules 100 is shown in FIG. 2B. A spacer array 121 of spacing structures 122a includes a spacing structure 122a for each corresponding image sensing device 107 formed on wafer 101. A transparent enclosure layer 115 is assembled over spacer array 121. Later, during singulation, each imaging module 100 is separated out from array 150. In one packaging process embodiment, each IC 104 (FIG. 1A) is electrically separated prior to physical part singulation so that each IC 104 can be electrically tested at the wafer level.

Figure 3A:
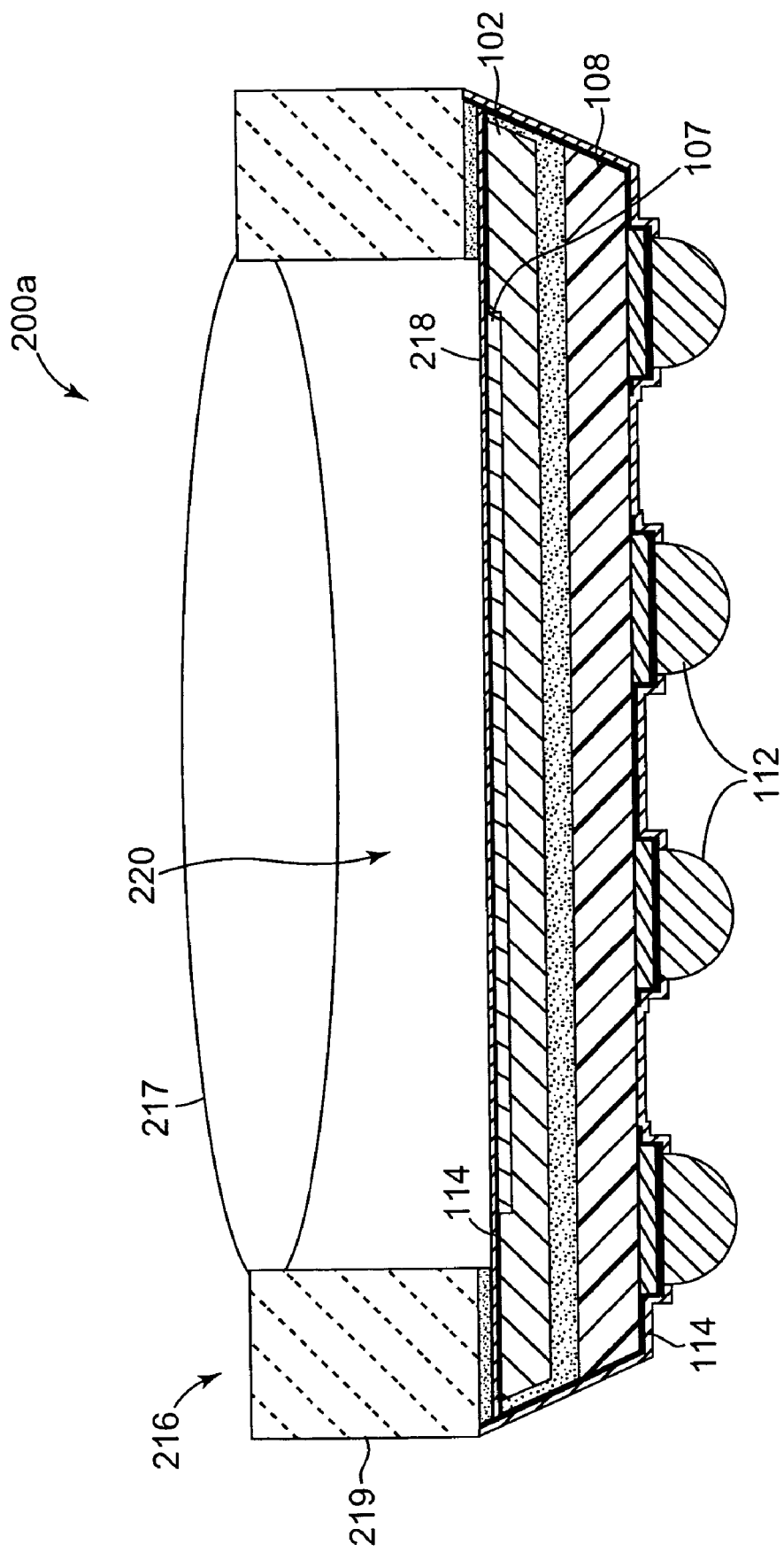
FIG. 3A illustrates one embodiment of a camera module that includes a transparent enclosure portion in the form of a lens.

FIG. 3A illustrates a camera module 200a according to one aspect of the present invention. The camera module 200a is similar to imaging module 100 in that camera module 200a includes semiconductor substrate 102, image sensing device 107, packaging substrate 108, electrical contacts 112, and redistribution structures 114. However, camera module 200a is characterized by a transparent enclosure portion 216 that includes a lens 217 adapted to direct an image onto image sensing device 107. In one embodiment, lens 217 is optically coupled to a multiplicity of pixels of image sensing device 107. In one form of such an embodiment, lens 217 directs an image onto image sensing device 107, illuminating all of the functional pixels of image sensing device 107.

Transparent enclosure portion 216 also includes a spacing structure 219 coupled to lens 217 and adapted to hold lens 217 at a selected distance and orientation relative to image sensing device 107. Transparent enclosure portion 216 also functions as an enclosure portion enclosing image sensing device 107. In one embodiment, spacing structure 219, lens 217, and semiconductor substrate 102 together define a cavity 220, which is similar to cavity 120 (FIG. 1A).

Similarly to transparent enclosure portion 116, transparent enclosure portion 216 can be formed from a variety of suitable materials. In one embodiment, transparent enclosure portion 216, including lens 217 and spacing structure 219, is molded from a contiguous piece of glass. In another embodiment, transparent enclosure portion 216 is molded from high-temperature plastic. In another embodiment, transparent enclosure portion 216 is assembled from separate parts including separate pieces for lens 217 and spacing structure 219.

Figure 3B:
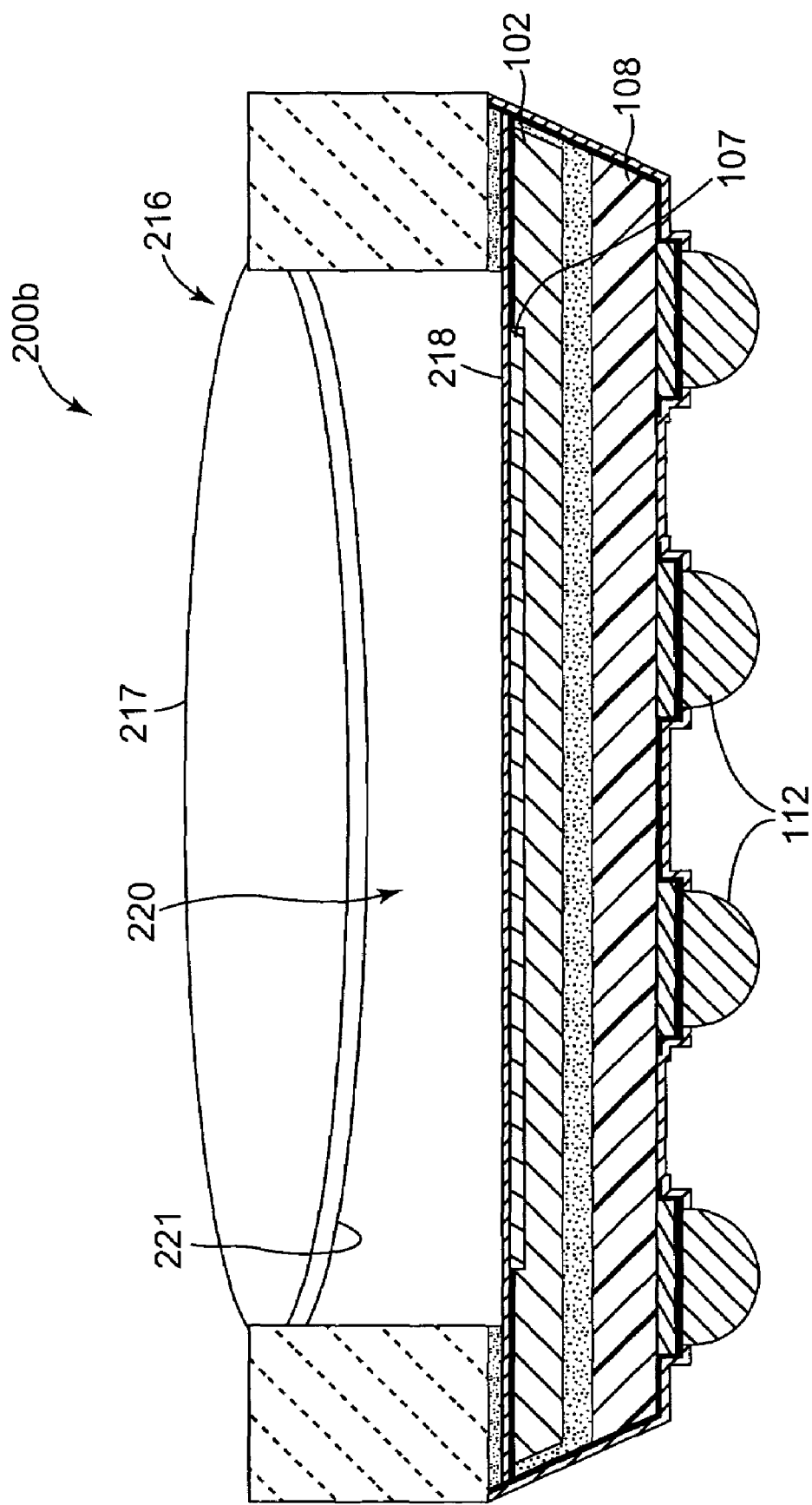
FIG. 3B is a diagram illustrating another embodiment of a transparent enclosure portion of the camera module of FIG. 3A.

In one embodiment of camera module 200a, the surface of image sensing device 107 includes an optical filter indicated at 218 in FIG. 3A. In another embodiment, illustrated in FIG. 3B, transparent enclosure portion 216 of camera module 200b includes an optical filter 221 on the surface of the lens 217.

According to another aspect of the present invention, an integrally-packaged imaging module with a lens support is provided. FIG. 4 illustrates one such partial camera module embodiment, indicated at 250. Partial camera module 250 includes imaging module 100. Partial camera module 250 also includes a lens support 252, which is attached to transparent enclosure portion 116 of imaging module 100. Lens support 252 includes a spacing structure 253 having coupling features 255 for coupling a lens 254 to spacing structure 253.

The attachment of spacing structure 253 to imaging device 100 is provided by adhesive layer 256. In one embodiment, adhesive layer 256 is achieved with an epoxy compound. In another embodiment, spacing structure 253 is welded to transparent enclosure portion 116 of imaging module 100. One skilled in the art will recognize that there are a variety of ways in which spacing structure 253 can be attached to imaging module 100.

In one embodiment, lens 254 is not a part of partial camera module 250. Rather, lens 254 is attached to lens support 252 at the tail end of the end product assembly process. Excluding lens 254 from partial camera module 250 permits lens 254 to be made from low cost materials that are unable to withstand re-flow soldering conditions. Partial camera module 250 is first assembled into the end product using solder re-flow processing. Later, lens 254 is installed into lens support 252. Once lens 254 is installed, partial camera module 250 effectively becomes a complete camera module.

The positioning of lens 254 relative to image sensing device 107 adjusts a focus of the optical system of partial camera module 250. The positioning is important for the image quality of the partial camera module 250. In one embodiment, the spacing distance of spacing structure 253 is adjusted during partial camera module 250 fabrication. In one embodiment, the spacing structure 253 is machined to an appropriate height. In another embodiment, the height of adhesive layer 256 is controlled. In another embodiment, as presented above, the height of spacing structure 122 is adjusted to control the distance between image sensing device 107 and the position of lens 254.

Figure 5A:
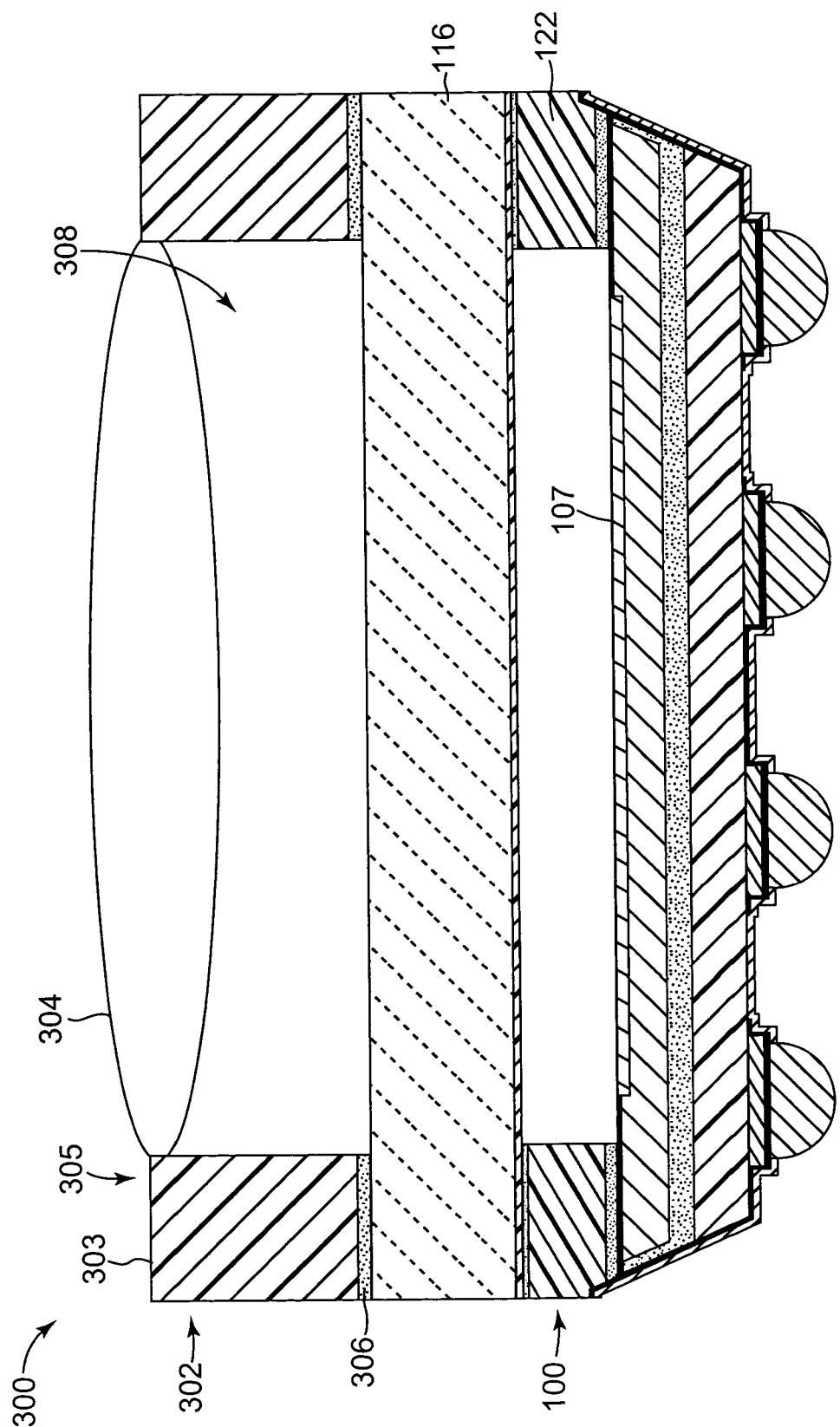
FIG. 5A illustrates one embodiment of a camera module that includes a lens assembly and a cavity within the wafer level packaging.

FIG. 5A illustrates a camera module 300 according to one aspect of the present invention. Camera module 300 includes imaging module 100, to which a lens assembly 302 is attached. Lens assembly 302 includes a spacing structure 303 coupled to a lens 304. Spacing structure 303 and its coupling features for coupling to lens 304 are collectively referred to herein as a lens support 305. Lens 304 is adapted for directing an image onto image sensing device 107 of imaging module 100. Lens support 305 is adapted for maintaining a fixed positioning of lens 304 relative to the outer surface of transparent enclosure portion 116. In one embodiment, lens support 305 and lens 304 are formed from a single moldable material, such as glass or clear plastic.

In order for lens 304 to function effectively, the volume 308 under the inner surface of lens 304 has an index of refraction that is different from that of lens 304. Spacing structure 303 is adapted to be attached to transparent enclosure portion 116. The points of attachment are defined by an adhesive layer 306. In one embodiment, adhesive layer 306 includes an epoxy compound. In another embodiment, spacing structure 303 is attached to transparent enclosure portion 116 via one or more welded joints.

In one embodiment of camera module 300, during assembly, spacing structure 303 is machined or re-formed to focus the optical system including lens 304 and image sensing device 107 within an acceptable tolerance of ±15 μm. In another embodiment, spacing structure 122 of imaging module 100 is machined or re-formed during assembly to provide the appropriate lens/image sensing device positioning. Adjusting the relative positioning of lens 304 and image sensing device 107 by changing the spacing dimensions of one or more spacing structures permits higher-tolerance/lower cost materials to be used. For example, controlling the distance between lens 304 and image sensing device 107 allows the use of a low-cost transparent enclosure portion material 116 having a thickness tolerance of ±50 μm, while maintaining the lens 304 and image sensing device 107 positioning tolerance of ±15 μm.

In one embodiment, camera module 300 is assembled in its entirety by a wafer-level packaging process similar to the process illustrated in FIG. 2B. In one embodiment, the spacing adjustment is performed on spacer array 121 automatically as part of the wafer-level packaging process. In another embodiment, the spacing adjustment is performed on the spacing structure 303.

Figure 5B:
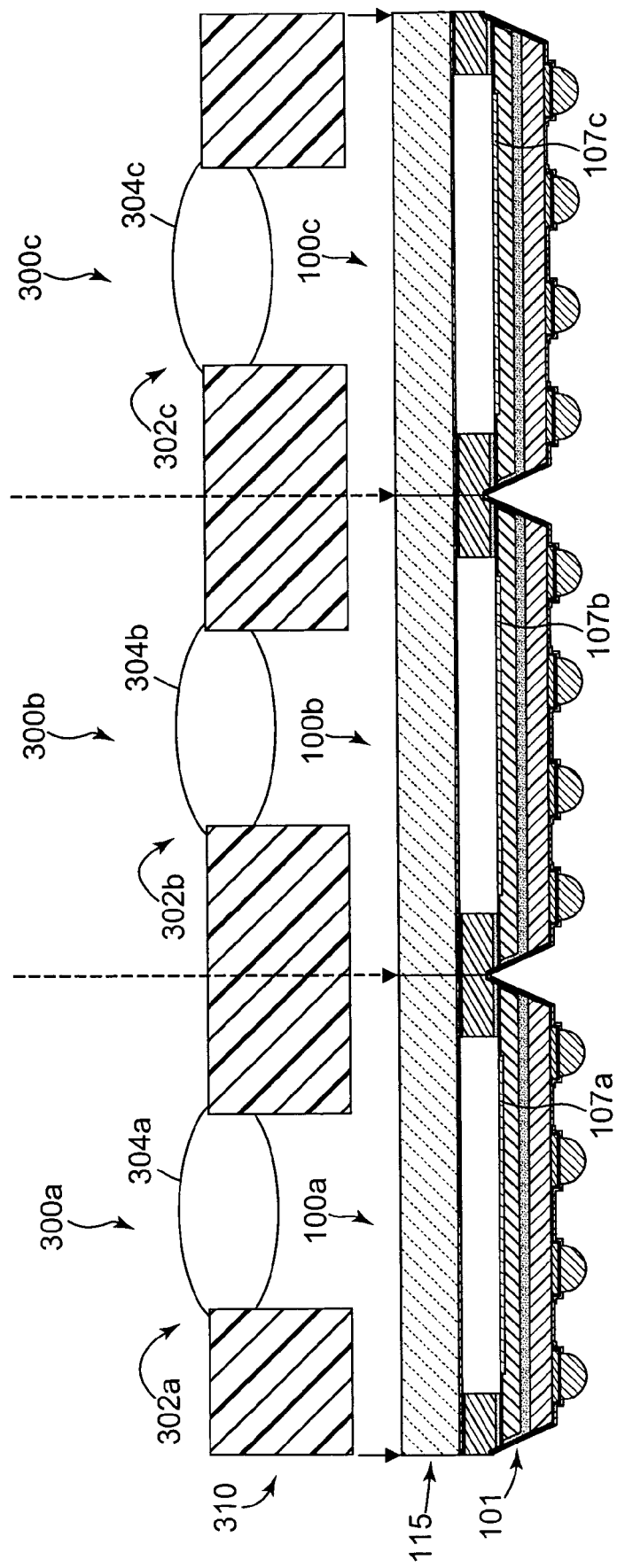
FIG. 5B is a diagram illustrating one embodiment of a wafer level packaging process for assembling the camera module of FIG. 5A, the process including attaching a contiguous array of lens assemblies onto an un-singulated array of imaging modules.

FIG. 5B is a diagram illustrating a wafer level packaging process for assembling camera modules 300a, 300b, and 300c. A lens assembly array 310 is attached to the outer surface of the transparent enclosure layer 115 of array 150. Lens assembly array 310 includes contiguous lens assemblies 302a, 302b, and 302c arranged so that lenses 304a, 304b, and 304c are positioned over corresponding image sensing devices 107a, 107b, and 107c. In one embodiment, lens assembly array 310 is formed from a single molded piece of material. Later, during singulation, camera modules 300a, 300b, and 300c are separated along dicing planes 312a and 312b.

Figure 5C:
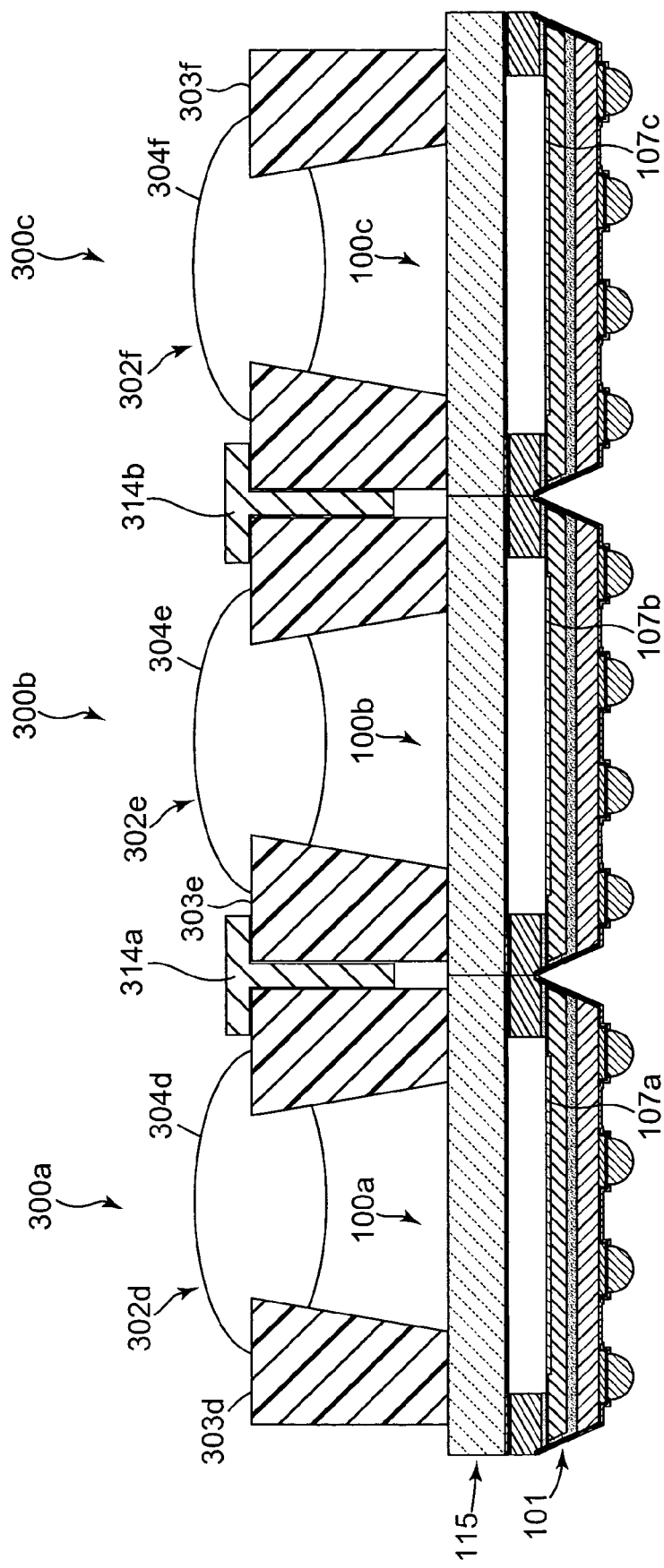
FIG. 5C illustrates another embodiment of a wafer level packaging process for assembling camera module of FIG. 5A, the process including attaching an array of individual lens assemblies onto an un-singulated array of imaging modules.
Figure 5D:
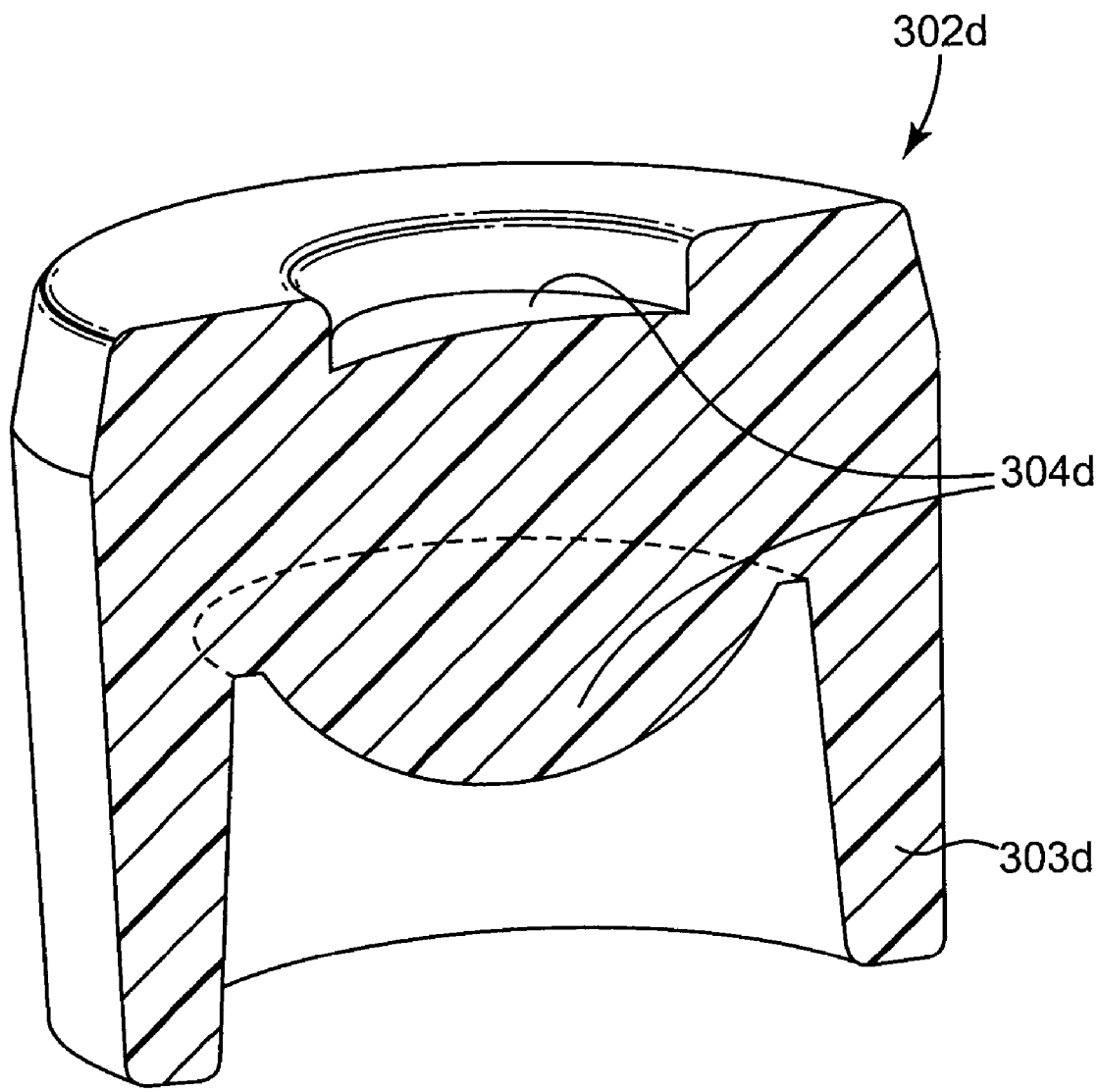
FIG. 5D is a cross-sectional view diagram illustrating one embodiment of an individual lens assembly used in the wafer level packaging process of FIG. 5C.

FIG. 5C illustrates another embodiment of a wafer level packaging process for assembling camera modules 300a, 300b, and 300c. In this embodiment, lens assemblies 302d, 302e, and 302f are each individual, discontiguous lens assemblies. Lens assembly spacers 314a and 314b are situated between each adjacent pair of lens assemblies, and provide positioning of lens assemblies 302d, 302e, and 302f along axes parallel to the plane of image sensing devices 107a, 107b, and 107c so that each lens 304d, 304e, and 304f, is centered over each corresponding image sensing device 107a, 107b, and 107c by a distance controlled by spacing structures 303d, 303e, and 303f. FIG. 5D is a cross-sectional diagram illustrating one form of lens assembly 302d. The embodiment of lens assembly 302d illustrated in FIG. 5D is a single molded piece combining the lens 304d and the spacing structure 303d.

Figure 5E:
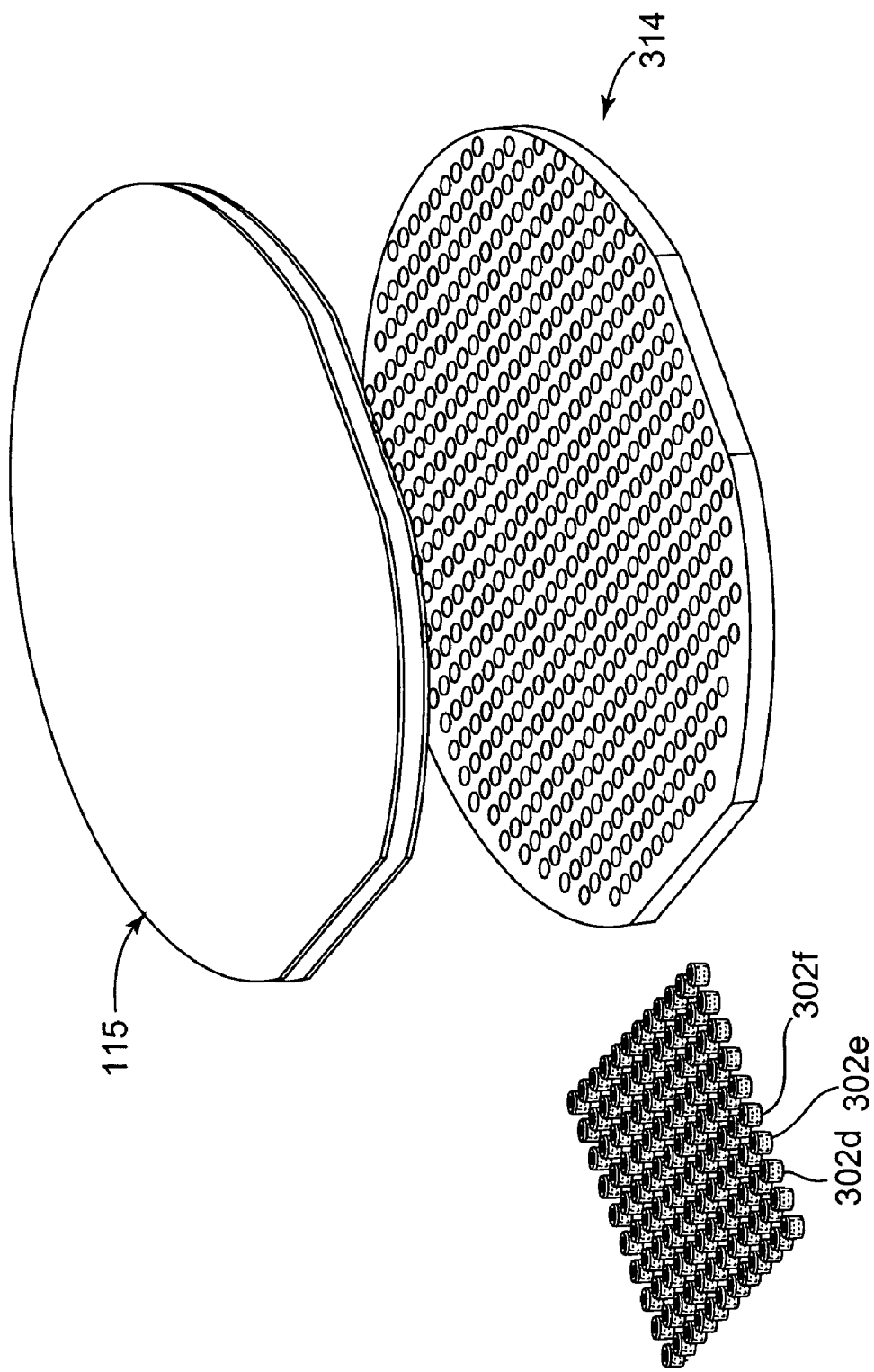
FIG. 5E illustrates one embodiment of a method for positioning an array of the individual lens assemblies in the wafer level packaging process of FIG. 5C.

In one embodiment, lens assemblies 302d, 302e, and 302f are simultaneously positioned over the transparent enclosure layer 115 of array 150. FIG. 5E is a diagram illustrating an assembly method according to this aspect of the invention. In this embodiment, lens assembly spacers 314a and 314b (FIG. 5C) are each a part of a lens assembly spacer tray 314, which is made up of lens assembly spacers. In this embodiment, each individual lens assembly 302d, 302e, and 302f, arrives to the wafer level assembly process in tray 314. After the lens assemblies 302d, 302e, and 302f are attached to transparent enclosure layer 115, tray 314 is removed.

In one embodiment, tray 314 is made from a material, such as Kovar®, having the same coefficient of thermal expansion (CTE) as silicon. In one embodiment, tray 314 has an accurately machined recess/cavity feature such as a tapered hole for each lens assembly position.

In one embodiment, tray 314 is used as an alignment tool for aligning each lens assembly with its corresponding image sensing device. In one form of this embodiment, tray 314 has fiducial marks suitable for optical alignment with features on the semiconductor wafer 101. Alignment can be achieved using automated vision systems or manual alignment. In one embodiment, where it is impractical to create fiducial marks especially for alignment purposes, existing features on the wafer 101 are used as fiducial marks. A portion of the lithographic pattern of the active area of an IC 104 can be as a sufficiently distinct feature for alignment. Since the repeated lithographic pattern of each IC 104 often extends past the edge of the wafer, incomplete and unusable IC patterns are formed at the wafer edge. In one embodiment, these partial IC sites are used for fiducial points without sacrificing a potentially good IC. In one embodiment, mating fiducial marks in the tray 314 are formed in a transparent portion of tray 314. For example, a lens recess in tray 314 corresponding to the position of a partial IC site is used for the window instead of a lens.

Depth of focus is balanced against field of view in alignment optics. Higher resolution alignment is possible with a larger field of view but with a shallow depth of focus. In one embodiment, the fiducial marks of tray 314 and of the semiconductor wafer 101 are located as close to the same plane as possible during alignment in order to reduce the depth of focus required in the alignment optical system. In one embodiment of an optical system, a depth of focus of 0.5 mm is used to provide good alignment resolution (<5 microns).

In another embodiment, an alignment method is employed that is based on silicon's transparency in the infrared wavelengths. In this embodiment, IR wavelengths are used in the optical alignment system to align the wafer 101 and tray 314 by viewing the fiducial marks through the wafer from behind.

In one embodiment of a manufacturing process for camera module 300, after singulation, the individual camera modules are kept in the tray 314 for further manufacturing and testing processes. In an alternative embodiment, tray 314 is diced up together with the wafer-level packaged array of camera modules 300.

In one embodiment, lens assembly 310 is a hybrid of the contiguous lens assembly array of FIG. 5B and the array of individual lens assemblies 302 of FIG. 5C. The hybrid lens array 310 is a molded array of individual lens assemblies 302 that are compliantly-interconnected such that compliant connecting elements extend between adjacent lens assemblies. The compliant connecting elements interconnect all the lens assemblies to be mounted on the semiconductor wafer 101 to form an array of lens assemblies that can be handled as a single entity. This greatly increases the convenience of handling the lens assemblies during wafer level packaging. The compliant interconnecting elements permit the lens assemblies to move easily in the plane in which the lens assemblies are arrayed to allow for aligning the assemblies with their corresponding image sensing devices. In one embodiment, the aligning is achieved using a lens assembly spacer tray 314.

Figure 6:
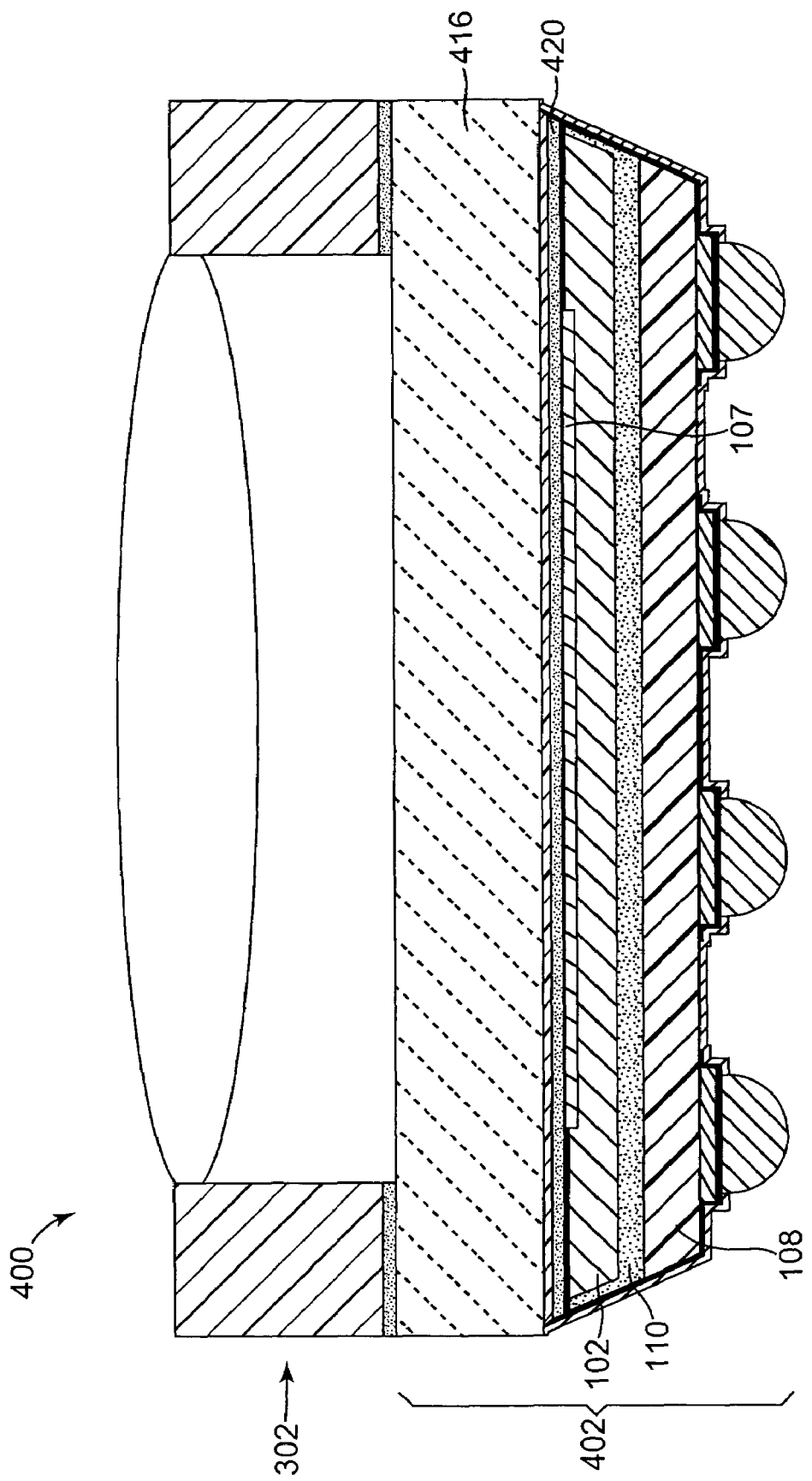
FIG. 6 illustrates one embodiment of a camera module that includes a lens assembly but that does not include a cavity.

FIG. 6 illustrates a camera module 400 that is a variation of camera module 300. Camera module 400 includes an imaging module 402 that is similar to imaging module 100, except that imaging module 402 does not include the cavity 120 of imaging module 100. In one embodiment of imaging module 402, transparent enclosure portion 116 is assembled over the image sensing device 107, and any gaps therebetween are filled with a transparent encapsulant having an index of refraction similar to that of transparent enclosure portion 116.

Figure 7:
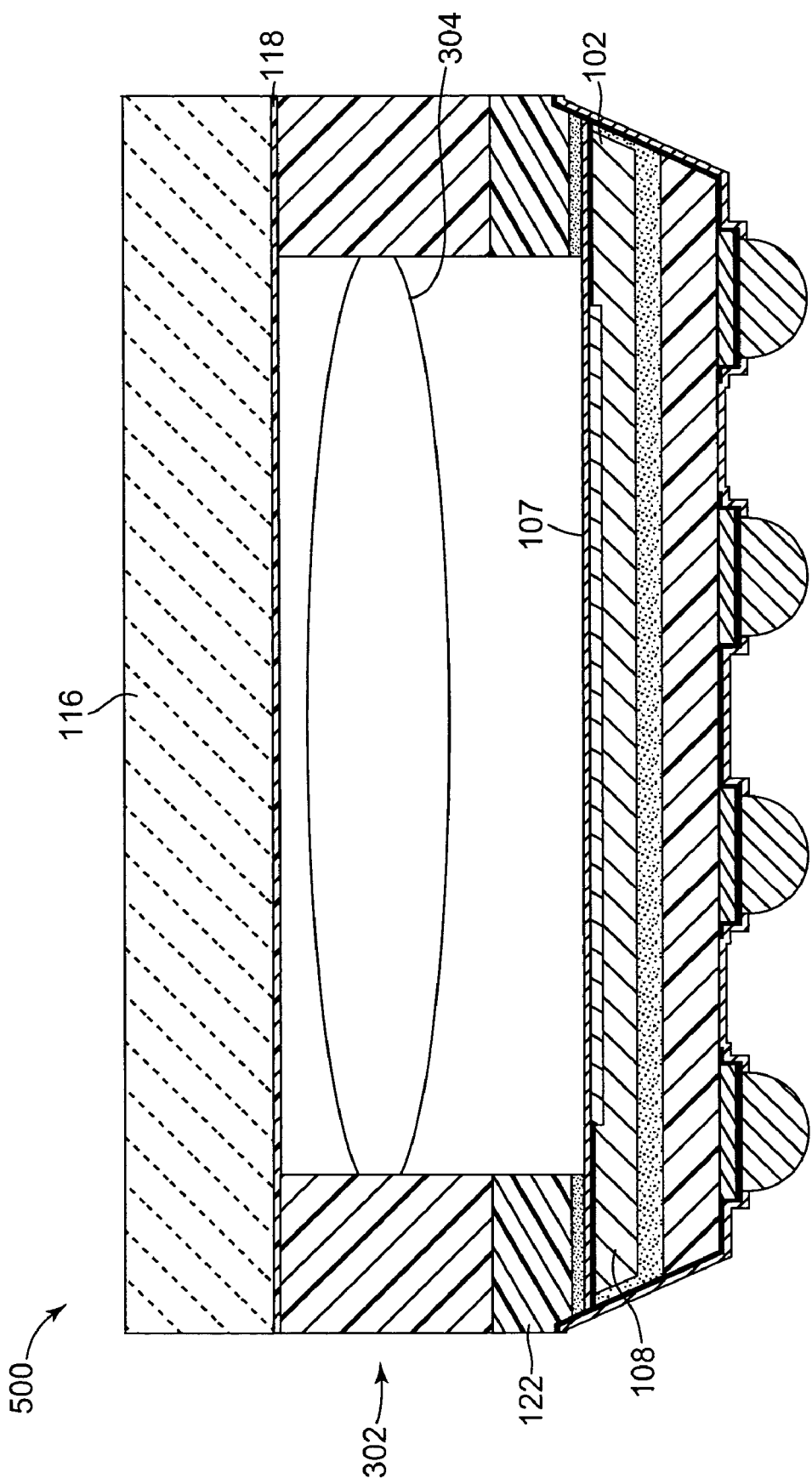
FIG. 7 illustrates another embodiment of a camera module that includes a transparent enclosure portion positioned over a lens assembly.

Another variation of camera module 300 is illustrated in FIG. 7 and indicated at 500. In camera module 500, lens assembly 302 is situated between semiconductor substrate 102 and transparent enclosure portion 116, which includes IR filter 118. In one embodiment, spacing structure 122 is situated between lens assembly 302 and semiconductor substrate 102. As with the embodiments presented above, spacing structure 122 is configurable during fabrication of camera module 500 to achieve a proper focus of lens 304.

Figure 8:
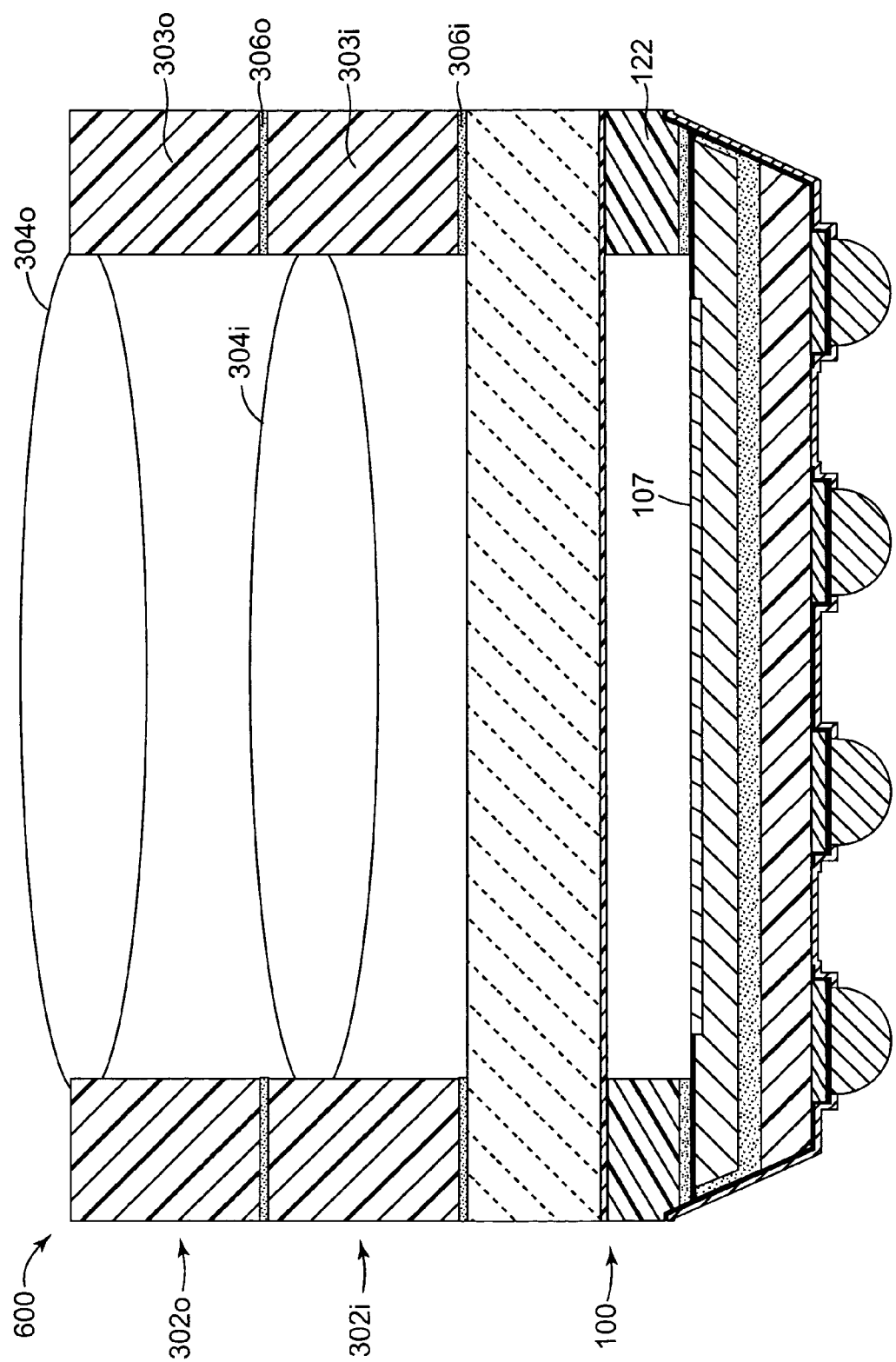
FIG. 8 is a diagram illustrating one embodiment of a camera module incorporating a dual lens optical system.

According to one aspect of the present invention, an integrally packaged camera module employing a dual-lens system is presented. FIG. 8 illustrates one such embodiment, indicated at 600. Camera module 600 includes imaging module 100, over which are mounted inner lens assembly 302*i* and outer lens assembly 302*o*. The mounting points are defined, respectively, by inner adhesive layer 306*i*, and outer adhesive layer 306*o*. Outer lens assembly 302*o* includes outer lens 304*o* adapted and positioned to direct an image onto image sensing device 107 through inner lens 304*i* of inner lens assembly 302*i*. Outer lens assembly 302*o* and inner lens assembly 302*i* each include, respectively, outer lens spacing structure 303*o* and inner lens spacing structure 303*i*. In one embodiment, both of the lens spacing structures 303*o* and 303*i* are configurable in the assembly process of camera module 600 to achieve a proper focus for the camera module 600. In one embodiment, the spacing distance provided by outer lens spacing structure 303*o* is adjusted by grinding back the material, but the inner lens spacing structure 303*i* is not adjusted in this manner. Instead, spacing structure 122 is adjusted to position the inner lens 304*i*.

In one embodiment, inner lens 304*i* is formed from low-cost transparent plastic that does not need to be capable of withstanding re-flow soldering process temperatures. In this embodiment, the outer lens assembly 302*o* is formed from glass or high-temperature plastic material capable of withstanding the re-flow soldering processing temperatures. Therefore, the outer lens assembly 302*o* protects the inner lens 304*i* from the high temperatures.

Figure 9:
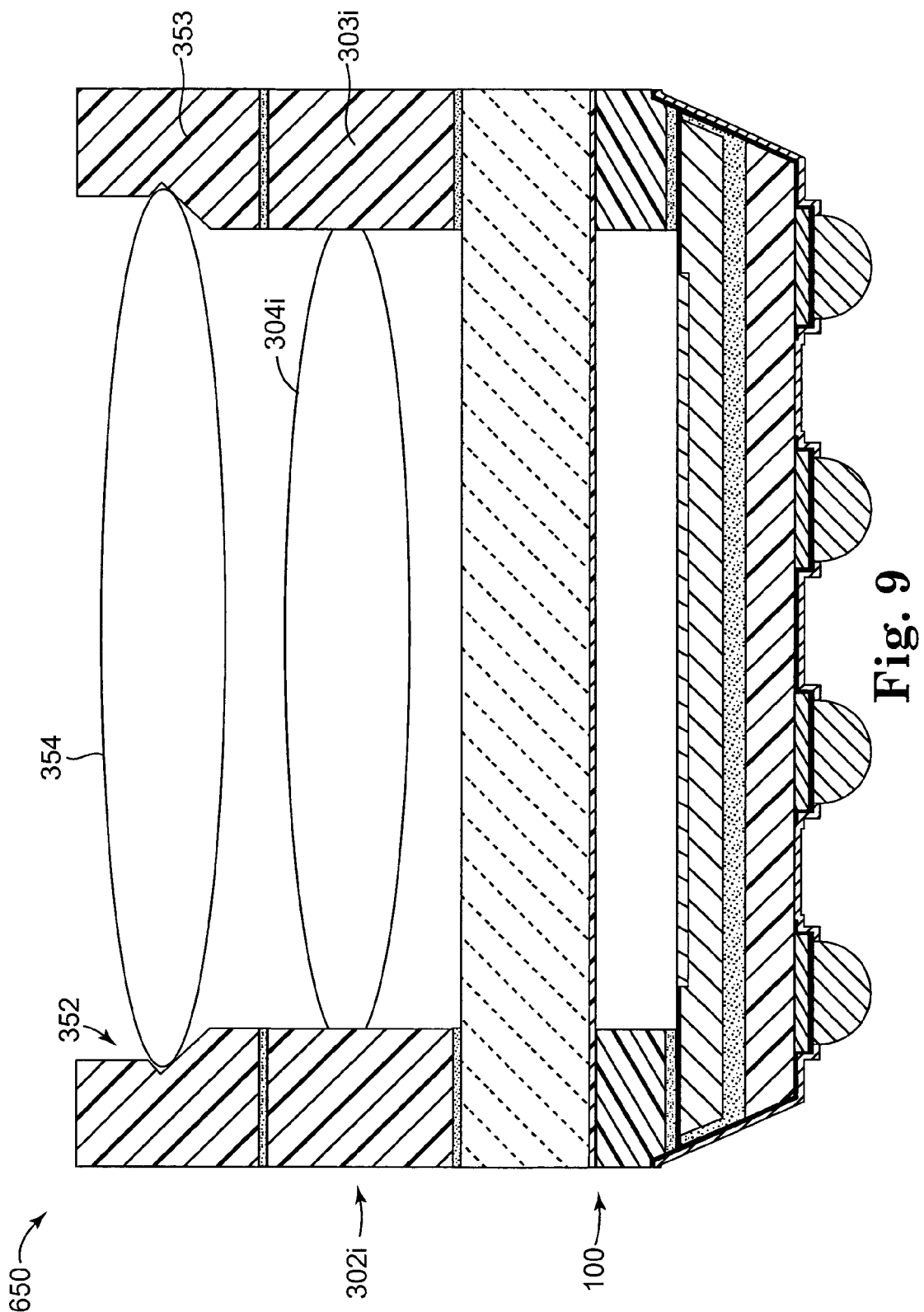
FIG. 9 illustrates another embodiment of a dual lens camera module.

Another embodiment of a dual lens camera module is illustrated in FIG. 9 and indicated at 650. Camera module 650 includes an inner lens assembly 302*i* having inner lens 304*i* suspended over imaging module 100 by spacing structure 303*i*. Camera module 650 also includes an outer lens support indicated at 352. Outer lens support 353 is adapted to couple with an outermost lens 354. In one embodiment, lens 354 is not fabricated as part of wafer level packaged camera module 650. Instead, lens 354 is installed into lens support 352 in a separate assembly step.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, electrical, materials, and optical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An integrally packaged imaging module, comprising:
   an integrated circuit (IC) including an image sensing device formed on a semiconductor substrate;
   a first adhesive layer located on at least a portion of a top surface of the semiconductor substrate;
   a first spacing structure having a first height, the first spacing structure affixed to the semiconductor structure using the first adhesive layer;
   a lens assembly located on at least a portion of a top surface of the first spacing structure, the lens assembly providing a second spacing structure;
   a transparent enclosure portion having a surface area extending substantially to the periphery of the second spacing structure, the transparent enclosure portion disposed on top of the second spacing structure defining a cavity above the image sensing device of the IC, the cavity having a cavity height that is substantially equal to the first and second heights of the first and second spacing structures, and
   the lens assembly includes a lens, wherein only the lens is disposed in the cavity.

2. The integrally packaged imaging module of claim 1, wherein the transparent enclosure portion includes material having infra-red filtering properties, wherein the desired range of wavelengths consists of wavelengths shorter than a cutoff wavelength associated with the infra-red filtering material.

3. The integrally packaged imaging module of claim 1, wherein the transparent enclosure portion includes a lens optically coupled with a multiplicity of pixels of the image sensing device.

4. The integrally packaged imaging module of claim 1, further comprising a lens support separate from the spacing structure and affixed to a top surface of the transparent enclosure portion, the lens support configured to support a lens over the transparent enclosure portion.

5. The integrally packaged imaging module of claim 4, wherein the lens support and the lens are preassembled into a lens assembly.

6. The integrally packaged imaging module of claim 1, wherein the spacing structure includes a set of four non-contiguous pieces surrounding a perimeter of the IC.

7. An integrally packaged imaging module, comprising:
an integrated circuit (IC) including an image sensing device formed on a semiconductor substrate;
wafer-level packaging enclosing the IC and formed at a semiconductor wafer level when the IC is positioned on a semiconductor wafer, and including:
a packaging substrate, wherein the semiconductor substrate is positioned over the packaging substrate and extends over substantially an entire top surface of the packaging substrate;
a transparent enclosure portion extending over substantially an entire top surface of the packaging substrate and adapted to permit image acquisition of an image by the image sensing device over a desired range of wavelengths;
a first lens support adapted to suspend a first lens so that the first lens directs the image onto the image sensing device;
a first spacing structure adapted to provide a spacing between the suspended first lens and the image sensing device;
a second spacing structure, formed by the first lens support, positioned on top of the first spacing structure;
the transparent enclosure portion positioned on top of the second spacing structure;
the semiconductor substrate, the first and second spacing structures, and the transparent enclosure portion forming a single cavity; and
the first lens is disposed in the single cavity.

8. The integrally packaged imaging module of claim 7 wherein the transparent enclosure portion prevents unwanted wavelengths from illuminating the image sensing device.

9. The integrally packaged imaging module of claim 7, wherein the first spacing structure is configurable during assembly of the integrally packaged imaging module to achieve a desired focus of the image onto the image sensing device.

10. The integrally packaged imaging module of claim 7, wherein the first spacing structure is a part of the first lens support.

11. The integrally packaged imaging module of claim 7, wherein a thickness of a packaging layer is configurable during fabrication of the integrally packaged imaging module to achieve a desired focus of the image directed onto the image sensing device.

12. The integrally packaged imaging module of claim 7, wherein the first lens support is preassembled with the first lens into a first lens assembly.

13. The integrally packaged imaging module of claim 7, wherein the wafer-level packaging further includes a second lens support coupled to the first lens support, the second lens support adapted to suspend a second lens so that the second lens directs the image onto the image sensing device through the first lens.

* * * * *